(12) United States Patent
Zhu et al.

(10) Patent No.: US 11,005,153 B1
(45) Date of Patent: May 11, 2021

(54) DISPLAY PANEL AND DISPLAY DEVICE

(71) Applicant: Xiamen Tianma Micro-Electronics Co., Ltd, Xiamen (CN)

(72) Inventors: Yihua Zhu, Xiamen (CN); Qingjun Lai, Xiamen (CN)

(73) Assignee: Xiamen Tianma Micro-Electronics Co., Ltd, Xiamen (CN)

( * ) Notice: Subject to any disclaimer, the term of this patent is extended or adjusted under 35 U.S.C. 154(b) by 0 days.

(21) Appl. No.: 16/890,817

(22) Filed: Jun. 2, 2020

(30) Foreign Application Priority Data

Apr. 29, 2020 (CN) .......................... 202010358912.1

(51) Int. Cl.
| | |
|---|---|
| *H01Q 1/22* | (2006.01) |
| *H01L 27/32* | (2006.01) |
| *G02F 1/1333* | (2006.01) |
| *G02F 1/1368* | (2006.01) |
| *H01Q 1/24* | (2006.01) |

(52) U.S. Cl.
CPC ......... *H01Q 1/2225* (2013.01); *G02F 1/1368* (2013.01); *G02F 1/13338* (2013.01); *H01L 27/3262* (2013.01); *H01Q 1/243* (2013.01)

(58) Field of Classification Search
CPC ... H01Q 1/2225; H01Q 7/00; G06K 19/07773
See application file for complete search history.

(56) References Cited

U.S. PATENT DOCUMENTS

| | | | | |
|---|---|---|---|---|
| 2006/0120082 | A1* | 6/2006 | Choo ................ | G02F 1/133603 362/276 |
| 2011/0050657 | A1* | 3/2011 | Yamada .............. | H01L 51/5237 345/204 |
| 2011/0101331 | A1* | 5/2011 | Yamazaki ............... | H01L 21/84 257/43 |
| 2012/0105370 | A1* | 5/2012 | Moore .................. | G06F 3/0412 345/174 |
| 2016/0064823 | A1* | 3/2016 | Tsukuda ................. | H01Q 1/526 343/702 |
| 2019/0237875 | A1* | 8/2019 | Yamagishi ....... | G06K 19/07749 |

FOREIGN PATENT DOCUMENTS

| | | |
|---|---|---|
| CN | 106597717 A | 4/2017 |
| CN | 109716585 A | 5/2019 |

* cited by examiner

*Primary Examiner* — Shaheda A Abdin
(74) *Attorney, Agent, or Firm* — Christensen O'Connor Johnson Kindness PLLC

(57) ABSTRACT

A display panel and a display device are provided. The display panel includes sub-pixels located in a display area, first and second substrate that are oppositely arranged, a first electrode layer, an antenna layer, and a magnet isolating layer including at least one magnet isolator. The first electrode layer is located at a side of the first substrate facing the second substrate, and a first electrode of the first electrode layer covers at least two sub-pixels in a first direction. The antenna layer includes at least one antenna including a multi-turn antenna coil. One magnet isolator corresponds to at least one antenna. Along a thickness direction of the display panel, the magnet isolating layer is disposed between the first electrode layer and the antenna layer. The magnet isolator is disposed between the first electrode and the antenna coil.

14 Claims, 8 Drawing Sheets

DISPLAY PANEL AND DISPLAY DEVICE

CROSS-REFERENCE TO RELATED APPLICATIONS

The present application claims priority to Chinese Patent Application No. 202010358912.1, filed on Apr. 29, 2020, the content of which is incorporated herein by reference in its entirety.

TECHNICAL FIELD

The present disclosure relates to the field of display technologies, and in particular, to a display panel and a display device.

BACKGROUND

Near Field Communication (NFC) is researched and developed based on non-contact radio frequency identification technology in combination with wireless interconnection technology, and has gradually become a safe and fast way to communicate using various electronic products in our daily lives. Integrating NFC in mobile terminals to realize applications such as mobile payment, electronic ticketing, access control recognition, mobile identity recognition, and anti-counterfeiting has become a favored factor when consumers choose mobile terminals.

NFC mainly uses an antenna to realize transmission and interaction of a chip and an outside world through coupling of a magnetic field. A main way in which the NFC technology is applied to the mobile terminals is to install the NFC antenna on a flexible printed circuit board, then provide the flexible printed circuit board on a battery on back of the mobile terminal, and add a piece of ferrite between the battery and the flexible printed circuit board. However, when a metal shell is used as the back casing of the mobile terminal, the metal shell will shield a magnetic field, so NFC cannot be achieved, or signal is poor.

SUMMARY

In view of the above, embodiments of the present disclosure provide a display panel and a display device to solve the above problems.

In a first aspect, an embodiment of the present disclosure provides a display panel. The display panel has a display area and a non-display area surrounding the display area. The display panel includes a plurality of sub-pixels located in the display area, a first substrate, a second substrate, a first electrode layer, an antenna layer, and a magnet isolating layer. The second substrate is opposite to the first substrate, the first electrode layer is located at a side of the first substrate facing towards the second substrate, and the first electrode layer includes at least one first electrode. The at least one first electrode covers at least two of the plurality of sub-pixels in a first direction. The antenna layer includes at least one antenna, and one of the at least one antenna includes a multi-turn antenna coil. The magnet isolating layer includes at least one magnet isolator, and one of the at least one magnet isolator corresponds to at least one of the at least one antenna. Along the first direction, the magnet isolating layer is disposed between the first electrode layer and the antenna layer, and the first direction is a thickness direction of the display panel.

In a second aspect, an embodiment of the present disclosure provides a display device, including the display panel provided in the first aspect.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure. Based on these drawings, those skilled in the art can obtain other drawings.

DESCRIPTION OF EMBODIMENTS

In order to better understand technical solutions of the present disclosure, the embodiments of the present disclosure are described in details with reference to the drawings. It should be clear that the described embodiments are merely part of the embodiments of the present disclosure rather than all of the embodiments. All other embodiments obtained by those skilled in the art shall fall into the protection scope of the present disclosure.

The terms used in the embodiments of the present disclosure are merely for the purpose of describing particular embodiments and not intended to limit the present disclosure. Unless otherwise noted in the context, the expressions in singular forms "a", "an", "the" and "said" used in the embodiments and appended claims of the present disclosure are also intended to represent plural forms.

It should be understood that the term "and/or" as used herein is merely an association describing the associated object, indicating that there may be three relationships. For example, A and/or B may indicate three cases: only A, A and B, or only B. In addition, a character "/" herein generally indicates that the contextual objects are in an "or" relationship.

In the description of this specification, it should be understood that terms "basically", "approximately", "around", "about", "generally" and "substantially" described in the claims and embodiments of the present disclosure mean that it can be generally recognized within a reasonable range of process operation or tolerance, rather than an accurate value.

It should be understood that although the terms first, second, etc. may be used to describe the electrode in the embodiments of the present disclosure, these electrodes should not be limited to these terms. These terms are only used to distinguish electrodes from one another. For example, a first electrode could also be referred to as a second electrode, and similarly, a second electrode could also be referred to as a first electrode without departing from the scope of the embodiments of the present disclosure.

Figure 1:
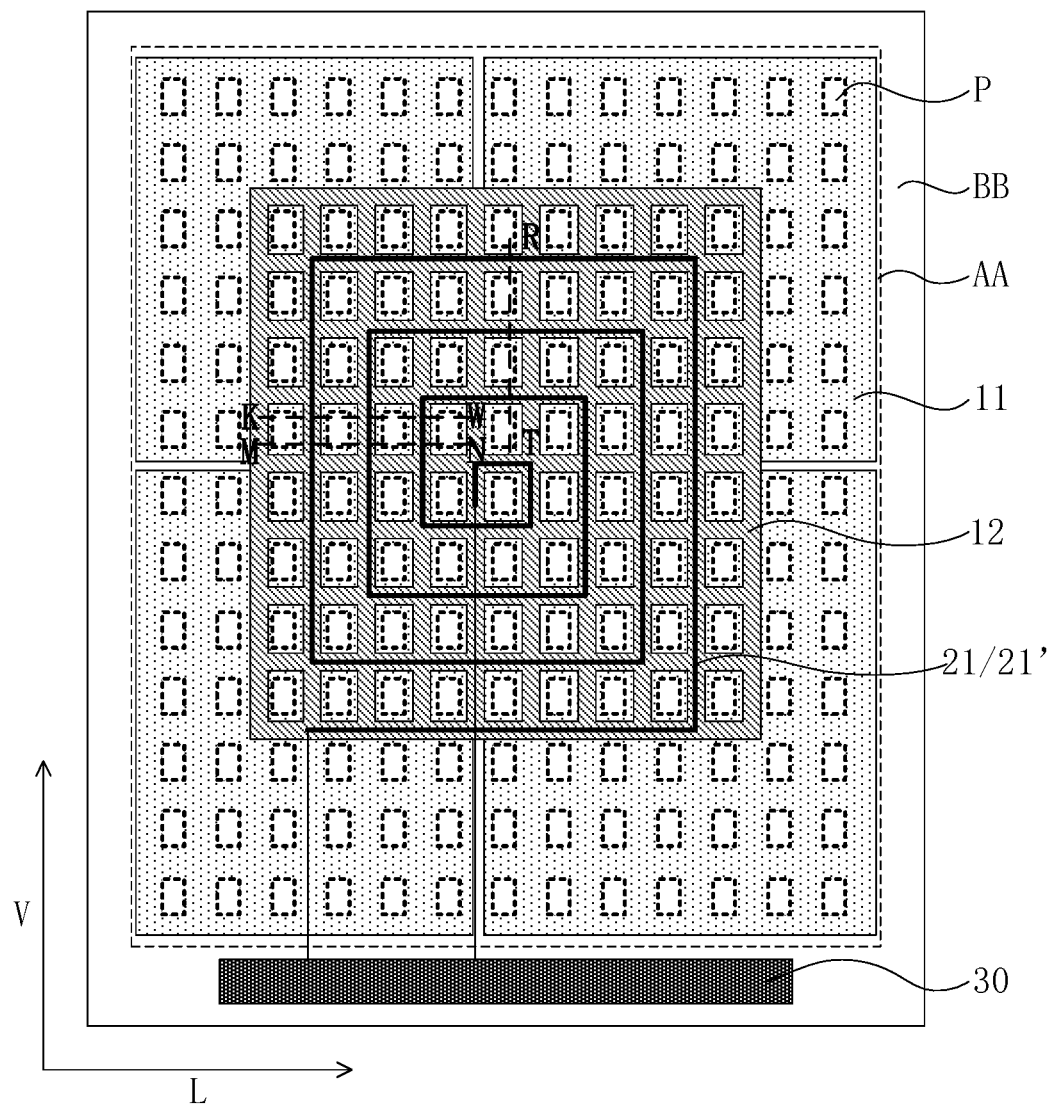
FIG. 1 illustrates a schematic diagram of a display panel provided by an embodiment of the present disclosure.
Figure 2:
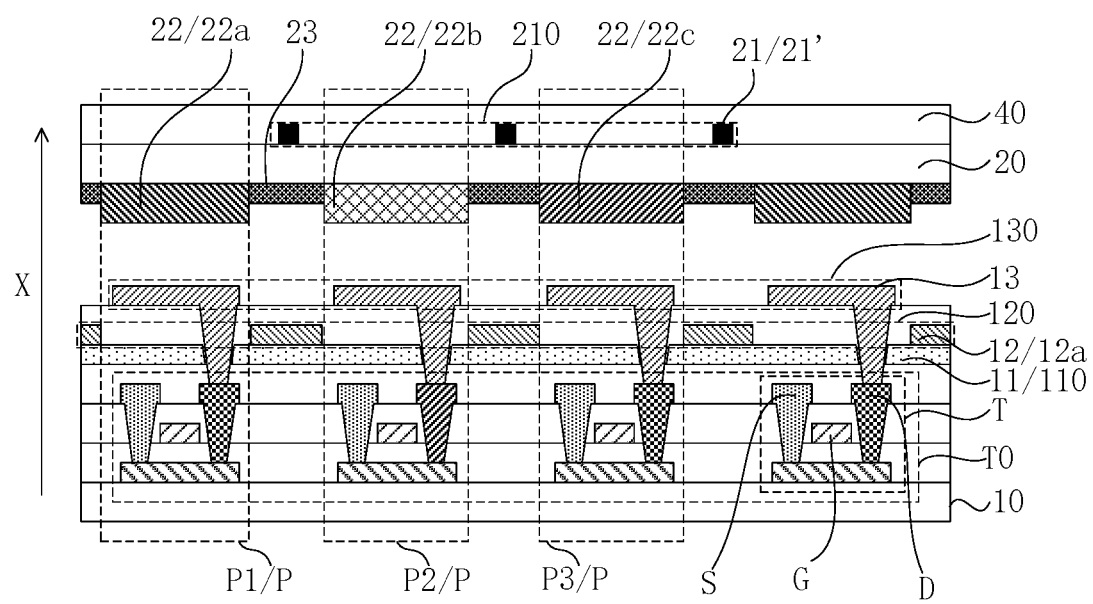
FIG. 2 illustrates a cross-sectional diagram taken along a direction MN shown in FIG. 1.

FIG. 1 illustrates a schematic diagram of a display panel provided by an embodiment of the present disclosure, and FIG. 2 illustrates a cross-sectional diagram taken along a direction MN shown in FIG. 1.

Referring to FIG. 1, the display panel provided by the embodiment of the present disclosure includes a display area AA and a non-display area BB surrounding the display area AA. The display area AA includes multiple sub-pixels P. The sub-pixels P can realize light emission with different gray levels, so that the display area AA can display images.

Referring to FIG. 2, along a thickness direction of the display panel, i.e., a first direction X, the display panel includes a first substrate 10, a second substrate 20, a first electrode layer 110, an antenna layer 210 and a magnet isolating layer 120. The second substrate 20 is opposite to the first substrate 10.

With continued reference to FIG. 2, the first electrode layer 110 is located at a side of the first substrate 10 facing towards the second substrate 20, that is, the first electrode layer 110 is located between the first substrate 10 and the second substrate 20. With reference to FIG. 1 and FIG. 2, the first electrode layer 110 includes at least one first electrode 11, and the first electrode 11 covers at least two sub-pixels P in the first direction X, that is, the first electrode 11 has a larger area than the sub-pixel P. In this case, the first electrode 11 is made of transparent conductive material, such as indium tin oxide.

With reference to FIG. 1 and FIG. 2, the antenna layer 210 includes at least one antenna 21, and the antenna 21 includes a multi-turn antenna coil 21'. As shown in FIG. 1, the antenna layer 210 includes one antenna 21, and the antenna 21 includes a four-turn antenna coil 21'. In addition, the antenna 21 is electrically connected to an integrated circuit 30 through a signal line, and the antenna 21 can be provided in the display panel as an antenna of the NFC, and configured to convert a received magnetic field emitted by an external NFC device into an electrical signal and transmit it to an integrated circuit 30 for processing, and convert an NFC related electrical signal in the display panel into a magnetic field and transfer it to the external NFC device.

Figure 3:
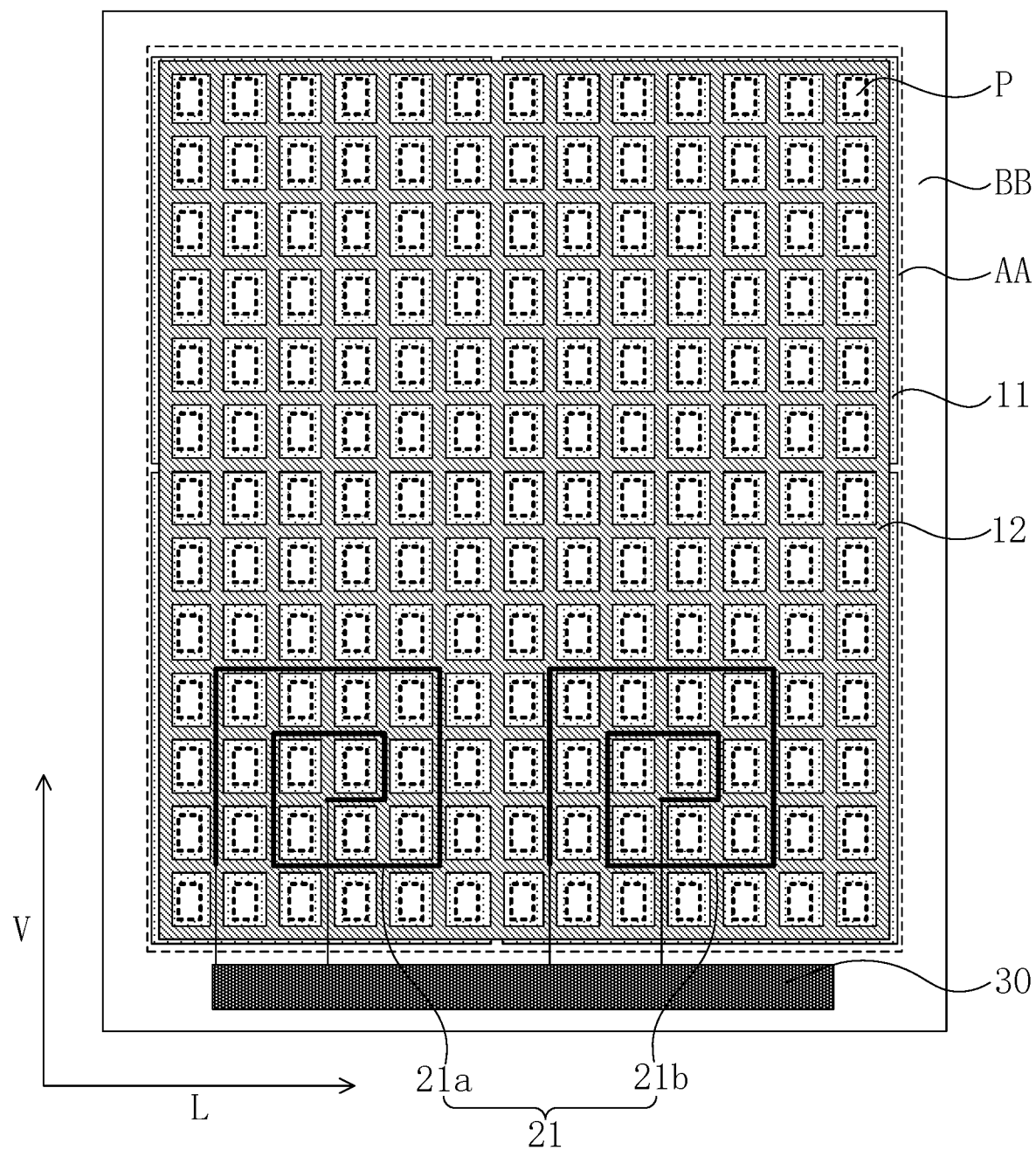
FIG. 3 illustrates a schematic diagram of a display panel provided by another embodiment of the present disclosure.

FIG. 3 illustrates a schematic diagram of a display panel provided by another embodiment of the present disclosure. As shown in FIG. 3, the antenna layer 210 includes two antennas 21, respectively an antenna 21a and an antenna 21b. That is, in addition to the NFC antenna, the display panel provided by the embodiment of the present disclosure can also include antennas for implementing other functions, such as a Bluetooth antenna and a wireless Internet antenna. In addition, the number of the antennas 21 having different functions included in the display panel is not limited to two, that is, the display panel can also include more than two antennas 21.

In an embodiment, the antenna 21 can include an N-turn antenna coil, and N is a positive number greater than 1. As shown in FIG. 1, the antenna 21 can include a four-turn antenna coil 21'. As shown in FIG. 3, the antenna can also include a two-turn antenna coil 21'. The specific number of turns of the antenna coil 21' can be set according to actual needs.

The magnet isolating layer 120 includes at least one magnet isolator 12 provided corresponding to at least one antenna 21 as described above. As shown in FIG. 1 and FIG. 3, the magnet isolating layer 120 can include a magnet isolator 12 disposed corresponding to all antennas 21 of the display panel. As shown in FIG. 1, in a case where the antenna layer of the display panel includes only one antenna 21, the magnet isolator 12 is provided corresponding to the antenna 21. As shown in FIG. 3, in a case where the antenna layer of the display panel includes at least two antennas 21, the magnet isolator 12 is arranged corresponding to all antennas 21. In an embodiment, the magnet isolating layer can also include at least two magnet isolators 12, so that when the antenna layer includes at least two antennas 21, the magnet isolators 12 can be provided in a one-to-one correspondence with the at least two antennas 21.

As shown in FIG. 2, along the first direction X, the magnet isolating layer 120 is disposed between the first electrode layer 110 and the antenna layer 210, and the magnet isolator 12 is provided between the antenna coil 21' and the first electrode 11.

The magnet isolator 12 has a structure having high magnetic permeability and extremely low electrical conductivity, and its magnetic permeability is much greater than that of the first electrode 11. For example, in a magnetic field environment having a same frequency, the magnetic permeability of the magnet isolator 12 is $10^{-4}$ H/m or above, while the magnetic permeability of the first electrode 11 is about $10^{-6}$ H/m; resistivity of the magnet isolator 12 is $10^{8}$ Ω/cm or above, while resistivity of the first electrode 11 is about $10^{-4}$ Ω/cm. Therefore, the magnetic field passing through the magnet isolator 12 will concentrate on the magnet isolator 12 to form a passage. Since the first electrode 11 is a conductor having a relatively large area, if the magnet isolator 12 is not provided, then there will be a large amount of magnetic field passing through the first electrode 11, which will produce an eddy current effect, and part of energy of the magnetic field is converted into heat energy, thereby consuming the magnetic field. Since the antenna 21 is a structure that generates a magnetic field and receives a magnetic field and performs magnetic field coupling, when the magnet isolating layer 120 is provided between the antenna layer 210 and the first electrode layer 110, the magnetic fields received and generated by the antenna coil 21' form a passage in the magnet isolator 12 after reaching the magnet isolator 12 without reaching the first electrode 11, thereby avoiding loss of the magnetic field and avoiding the magnetic field affecting the signal in the first electrode 11.

It should be noted that the sub-pixel P referred to in the embodiments of the present disclosure can be understood as the smallest unit of the display panel to perform light-emitting display. It can be understood that, in order to realize color display, the plurality of sub-pixels P of the display panel includes sub-pixels P for displaying different colors. In an embodiment of the present disclosure, as shown in FIG. 2, the multiple sub-pixels P of the display panel can include a sub-pixel P1 emitting light of a first color, a sub-pixel P2 emitting light of a second color, and a sub-pixel P3 emitting light of a third color. Moreover, the sub-pixel P1 emitting light of the first color, the sub-pixel P2 emitting light of the second color, and the sub-pixel P3 emitting light of the third color can constitute one pixel, in which the first color, the second color, and the third color are different colors and selected from red, green, and blue color. One first electrode 11 can cover at least two sub-pixels.

In an embodiment of the present disclosure, referring to FIG. 2, in order to ensure color mixing between different sub-pixels P, a black matrix 23 is provided between adjacent sub-pixels P, that is, the black matrix 23 covers an area between the adjacent sub-pixels P in the direction perpendicular to the first direction X. In an embodiment, the black matrix 23 can be disposed on a side of the second substrate 20 facing towards the first substrate 10.

It should be noted that in order to avoid that the antenna 21 affects a light-emitting area of the sub-pixel P, a projection of the antenna coil 21' on the second substrate 20 along the first direction X is all covered by a projection of the black matrix 23 on the second substrate 10 along the first direction X.

In an embodiment of the present disclosure, with continued reference to FIG. 2, in order to ensure that the sub-pixel P1 can emit light of the first color, the sub-pixel P2 can emit light of the second color and the sub-pixel P3 can emit light of the third color light, each sub-pixel P can include a color resistor 22. For example, the color resistor 22 included in the sub-pixel P1 is a first-color color resistor 22a, the color resistor 22 included in the sub-pixel P2 is a second-color color resistor 22b, and the color resistor 22 included in the sub-pixel P3 is a third-color color resist 22c. In an embodiment, the color resist 22 is disposed between adjacent black matrixes 23, and the color resist 22 can also be disposed at a side of the second substrate 20 facing towards the first substrate 10.

As shown in FIG. 2, the display panel further includes a switch array layer TO. The switch array layer TO includes multiple transistors T, and each sub-pixel P includes at least one transistor T. The transistor T includes a gate G, a source S, and a drain D.

Figure 4:
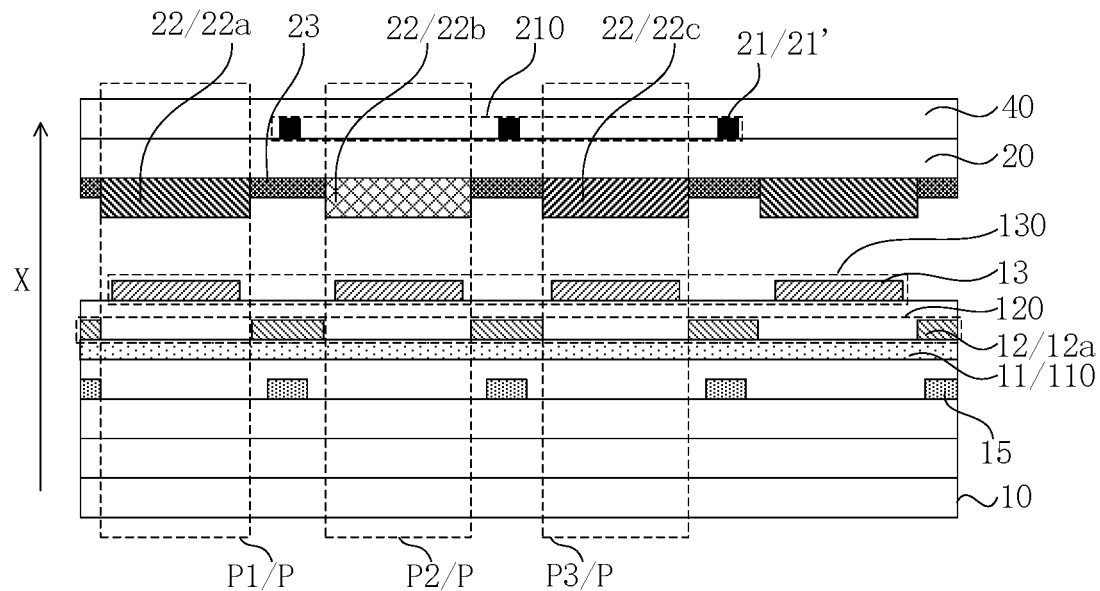
FIG. 4 illustrates a cross-sectional diagram taken along a direction KW shown in FIG. 1.
Figure 5:
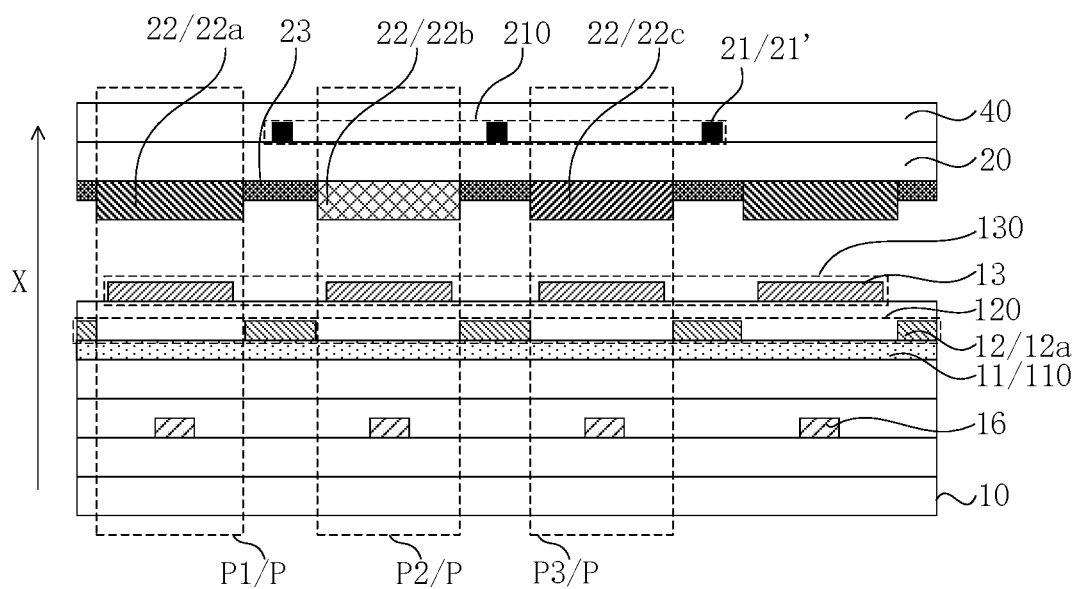
FIG. 5 illustrates a cross-sectional diagram taken along a direction RT shown in FIG. 1.

FIG. 4 illustrates a cross-sectional diagram taken along a direction KW shown in FIG. 1, and FIG. 5 illustrates a cross-sectional diagram taken along a direction RT shown in FIG. 1. A reason why the cross-sectional diagrams shown in FIG. 4 and FIG. 5 are different from the cross-sectional diagram shown in FIG. 2 is that FIG. 2, FIG. 4 and FIG. 5 illustrate cross-sectional diagrams of the display panel shown in FIG. 1 at different positions.

With reference to FIG. 2, FIG. 4 and FIG. 5, the display panel further includes a second electrode layer 130, and the second electrode layer 130 includes multiple second electrodes 13. The second electrodes 13 are in a one-to-one correspondence with the sub-pixels P, and the second electrode 13 is electrically connected to corresponding transistor T that is configured to provide the second electrode 13 with a data signal. In addition, as shown in FIG. 4 and FIG. 5, the display panel further includes a data line 15 and a gate line 16. The gate line 16 is electrically connected to the gate G of the transistor T and configured to provide a scan signal to the gate G to control the transistor T to turn on. The data line 15 is electrically connected to the source S of the transistor T and configured to provide a data signal for the source S. The data signal can be transmitted to the drain D of the transistor T through the turned-on transistor T, and then the data signal is finally transmitted, through the drain D, to the second electrode 13 electrically connected to the drain D. It should be noted that the data line 15 can be on a same layer as the source S of the transistor T, and the gate line 16 can be on a same layer as the gate G of the transistor T.

In an embodiment of the present disclosure, as shown in FIG. 2, the switch array layer TO is located at a side of the first electrode layer 110 facing away from the magnet isolating layer 120. Namely, in the thickness direction of the display panel, that is, the first direction X, the switch array layer TO is located at a lower side of the first electrode layer 110, and the magnet isolating layer 120 is located at an upper side of the switch array layer TO. Therefore, the magnet isolating layer 120 is not only located between the first electrode layer 110 and the antenna layer 210, but also located between the switch array layer TO and the antenna layer 210. In an embodiment, as shown in FIG. 4 and FIG. 5, the magnet isolator 12 is located between the antenna 21 and the data wire 15, and the magnet isolator 12 is located between the antenna 21 and the gate wire 16.

Since the data wire 15 and the gate wire 16 are usually made of metal materials, providing the magnet isolator 12 between the antenna 21 and the data line 15/the gate line 16 can prevent the magnetic field received or generated by the antenna 21 from reaching the data line 15 and the gate line 16 to produce an eddy current phenomenon and loss of the magnetic field, and prevent the data line 15 and the gate line 16 from generating a reverse magnetic field to cancel a communication magnetic field, thereby preventing a magnetic field loss from affecting wireless communication while ensuring that the antenna 21 is integrated in the display panel.

In an embodiment of the present disclosure, the second electrode layer 130 can be disposed at a side of the first electrode layer 110 close to the magnet isolating layer 120. As shown in FIG. 2, FIG. 4 and FIG. 5, along the first direction X, the second electrode 13 can be disposed above the magnet isolator 12, and the first electrode 11 is disposed below the magnet isolator 12, that is, the second electrode 13 can be disposed between the magnet isolator 12 and the antenna 21, and the first electrode 11 is disposed at a side of the magnet isolator 12 facing away from the antenna 21. In different embodiments, the second electrode 13 can also be disposed between the first electrode 11 and the magnet isolator 12, that is, both the first electrode 11 and the second electrode 13 can be located at the side of the magnet isolator 12 facing away from the antenna 21.

Figure 6:
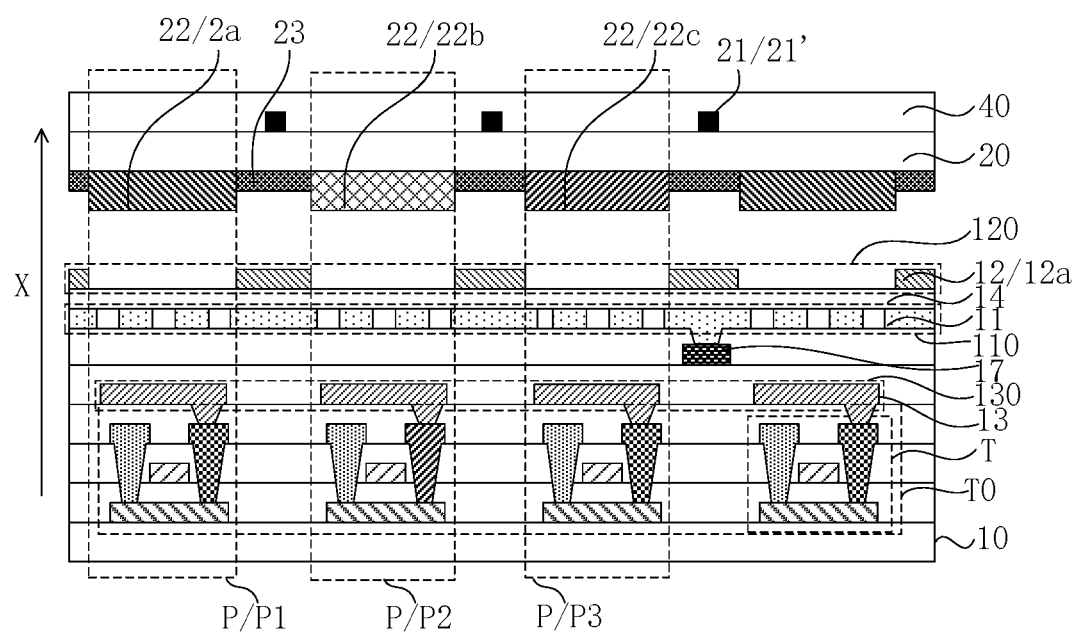
FIG. 6 illustrates another cross-sectional diagram taken along a direction MN shown in FIG. 1.

FIG. 6 illustrates another cross-sectional diagram taken along the direction MN shown in FIG. 1. As shown in FIG. 6, in an embodiment of the present disclosure, the second electrode layer 130 can also be disposed at a side of the first electrode layer 110 facing away from the magnet isolating layer 210. As shown in FIG. 6, along the first direction X, the second electrode 13 and the first electrode 11 are both disposed below the magnet isolator 12, that is, both the second electrode 13 and the first electrode 11 can be disposed at the side of the magnet isolator 12 facing away from the antenna 21. In addition, the second electrode layer 130 is disposed closer to the switch array layer TO than the first electrode layer 110, so a distance between the second electrode 13 and the transistor T is shortened, thus reducing risk of breakage of the electrical connection between the second electrode 13 and the transistor T.

In an embodiment of the present disclosure, the first electrode layer 110 includes multiple first electrodes 11. As shown in FIG. 1 and FIG. 3, the first electrode layer 110 includes four first electrodes 11. In different embodiments, the first electrode layer 110 can also include a larger number of first electrodes 11, and the first electrodes 11 can be reused as touch electrodes during a touch stage of the display panel.

It should be noted that although the first electrode 11 shown in FIG. 6 includes multiple gaps, parts between the gaps are still electrically connected. In other words, the first electrode 11 corresponding to the cross-sectional diagram shown in FIG. 6 is one first electrode 11, merely multiple slits (gaps) are provided on the first electrode 11 to ensure that an electric field between the first electrode 11 and the second electrode 13 can reach above the first electrode 11.

As shown in FIG. 6, in order to realize the touch function, the display panel further includes a touch line layer, and the touch line layer includes multiple touch lines 17. Each first electrode 11 is electrically connected to at least one of the touch lines 17, and the touch line 17 can be configured to transmit touch-related signals for the first electrode 11.

In the embodiment of the present disclosure, as shown in FIG. 6, the touch line layer is located at the side of the magnet isolating layer facing away from the antenna layer. That is, along the first direction X, the touch line layer is located at a lower side of the magnet isolating layer, and the antenna layer is located at an upper side of the magnet isolating layer. Therefore, the magnet isolating layer is also located between the touch line layer and the antenna layer. In an embodiment, as shown in FIG. 6, the magnet isolator 12 is located between the antenna 21 and the touch line 17.

Since the touch line 17 is usually made of a metal material, providing the magnet isolator 12 between the antenna 21 and the touch line 17 can prevent the magnetic field received or generated by the antenna 21 from reaching the touch line 17 to produce the eddy current phenomenon and the loss of magnetic field, and can prevent the touch line 17 from generating the reverse magnetic field that cancels the communication magnetic field, thereby preventing the magnetic field loss from affecting the communication effect while ensuring that the antenna 21 is integrated in the display panel.

As shown in FIG. 1 and FIG. 3, projections of the magnet isolators 12 on the first substrate 10 cover the projection of the at least one corresponding antenna 21 on the first substrate 10. As shown in FIG. 1, when one magnet isolator 12 can be provided corresponding to one antenna 21, then the projection of the magnet isolator 12 on the first substrate 10 in the first direction X covers the projection of the corresponding one antenna 21 on the first substrate 10 in the first direction X. One magnet isolator 12 can also be provided corresponding to multiple antennas 21, then the projection of the magnet isolator 12 on the first substrate 10 along the first direction X covers projections of the multiple antennas 21 on the first substrate 10 along the first direction X. In an embodiment, as shown in FIG. 3, one magnet isolator 12 is provided corresponding to the antenna 21a and the antenna 21b simultaneously, then the projection of the magnet isolator 12 on the first substrate 10 along the first direction X covers the projection of the antenna 21a on the first substrate 10 along the first direction X and also covers the projection of the antenna 21b on the first substrate 10 in the first direction X.

Since the projection of the magnet isolator 12 on the first substrate 10 covers the projection of the corresponding antenna 21 on the first substrate 10, as shown in FIG. 1 and FIG. 3, an area of the magnet isolator 12 can be equal to or larger than an area of the antenna 21. In order to effectively shield the magnetic field, the area of the magnet isolator 12 can be at least equal to the area of the antenna 21. Generally, magnetic induction lines of the magnetic field generated by the antenna 21 exist not only in an area where the antenna 21 is located, but also in a periphery of the antenna 21. Therefore, the area of the magnet isolator 12 should be larger than the area of the antenna 21, and the magnet isolator 12 completely covers the antenna 21.

In an embodiment of the present disclosure, as shown in FIG. 3, the area of the magnet isolator 12 can be substantially the same as the area of the display area AA of the display panel, that is, the magnet isolators 12 are uniformly arranged in the display area AA. In one aspect, the magnet isolator 12 can effectively shield the magnetic field outside the display panel to avoid signal interference of the magnetic field on the conductors in the display area AA during the near field communication process. In another aspect, thickness uniformity of the entire layer in the display area AA of the display panel can be ensured.

Figure 7:
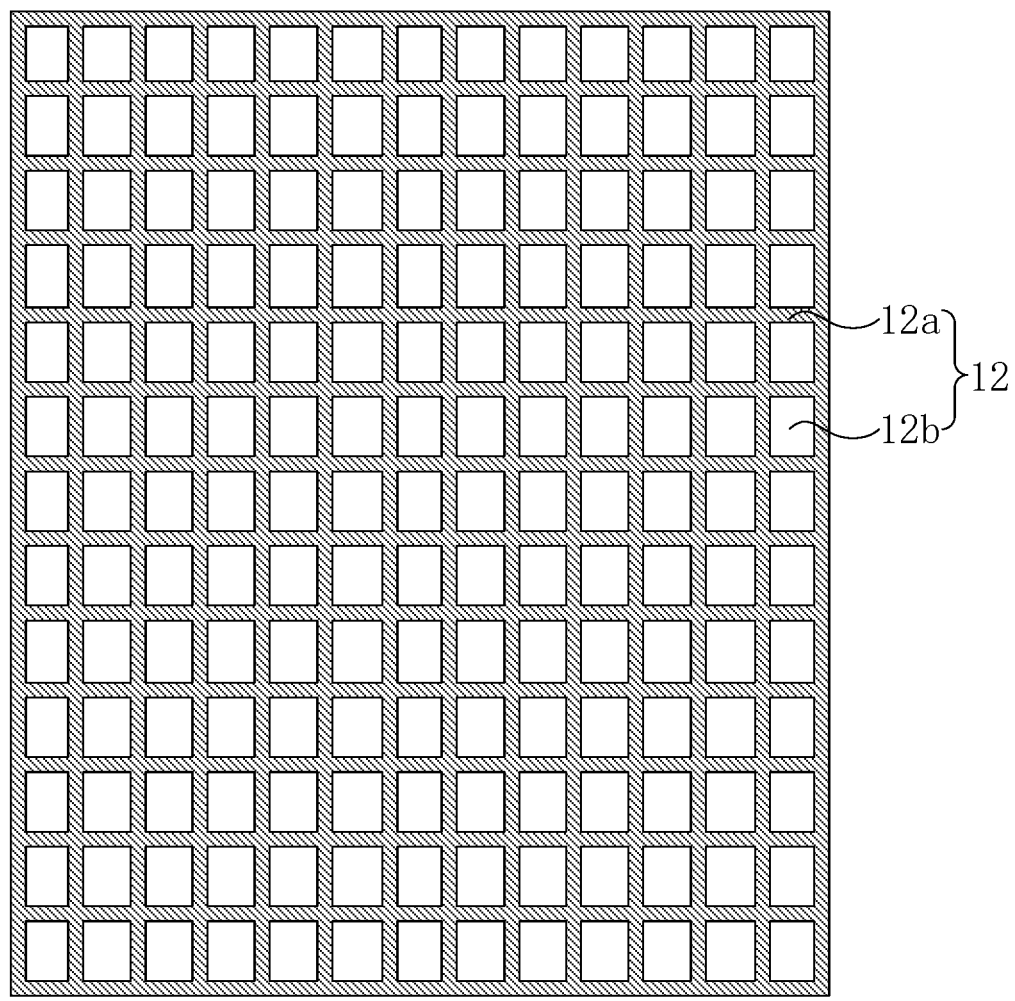
FIG. 7 illustrates a schematic diagram of a magnet isolator provided by an embodiment of the present disclosure.

FIG. 7 illustrates a schematic diagram of a magnet isolator provided by an embodiment of the present disclosure. As shown in FIG. 7, the magnet isolator 12 provided in the embodiment of the present disclosure can include a connecting portion 12a and multiple hollow portions 12b, and the connecting portion 12a is located between adjacent hollow portions 12b. With reference to FIG. 7 in conjunction with FIG. 1 and FIG. 3, a projection of the connecting portion 12a of the magnet isolator 12 in the first direction X is located between adjacent sub-pixels P, and a projection of the hollow portion 12b in the first direction X exposes the sub-pixel P, to ensure that the sub-pixel P can normally emit light and display.

It should be noted that since the magnet isolator 12 can be a grid-shaped structure including the hollow portion 12b and the connecting portion 12a, the area of the magnet isolator 12 can be an area corresponding to an outermost contour of the magnet isolator 12. In addition, since the antenna 21 includes the multi-turn antenna coil 21', the area of the antenna 21 can be an area corresponding to an outermost contour of the antenna 21.

Due to the high magnetic permeability of the magnet isolator 12, the magnet isolator 12 can be made of a specific material. In an embodiment, the connecting portion 12a of the magnet isolator 12 is made of materials including at least one of ferrite, amorphous iron-carbon mixture and nanocrystalline iron-carbon mixture. In an embodiment, the material used to make the connecting portion of the magnet isolator 12 is doped with ferrite, or an amorphous iron-carbon mixture, or a nanocrystalline iron-carbon mixture having a certain concentration. In another embodiment, the connecting portion 12a of the magnet isolator 12 is only made of at least one of ferrite, amorphous iron-carbon mixture, and nanocrystalline iron-carbon mixture.

If the material of the connecting portion 12a of the magnet isolator 12 includes at least one of ferrite, amorphous iron-carbon mixture, and nanocrystalline iron-carbon mixture, the connecting portion 12a of the magnet isolator 12 is generally opaque. Therefore, it can be seen from FIG. 1 to FIG. 6, the projection of the connecting portion 12a of the magnet isolator 12 on the first substrate 10 in the first direction X is covered by the projection of the black matrix 23 on the first substrate 10 in the first direction X, in order to prevent the opaque connecting portion 12a from affecting the display area of the sub-pixel P.

With continued reference to FIGS. 1-6, the projection of the connecting portion 12a of the magnet isolator 12 on the first substrate 10 along the first direction X covers the projection of the antenna coil 21' on the first substrate 10. It can be understood that the part shielding the magnetic field in the magnet isolator 12 is the connecting portion 12a of the grid-shaped magnet isolator 12, so a width of the connecting portion 12a can be as wide as possible, so as to provide more passages for the magnetic field, that is, to increase an effective electromagnetic shielding area of the magnet isolator 12. In order to achieve this effect, referring to FIG. 2, FIG. 4, FIG. 5 and FIG. 6, the width of the connecting portion 12a of the magnet isolator 12 can be equal to a width of the black matrix 23 arranged at a corresponding position, or equal to a width of the gap between the adjacent sub-pixels P arranged at corresponding position, so that the maximum effective electromagnetic shielding area can be obtained under a condition in which the magnet isolator 12 does not affect an aperture ratio, thereby further improving the electromagnetic shielding effect of the magnet isolator 12. It can be understood that the width of the connecting portion 12*a* of the magnet isolator 12 is the width of a single connecting portion 12*a*, that is, a width between adjacent hollow portions 12*b*.

It should be noted that, as shown in FIG. 1 to FIG. 6, the antenna coil 21' of the antenna 21 is disposed at the gap between adjacent sub-pixels P and disposed at gaps adjacent to each other in sequence. That is, as shown in FIG. 1 and FIG. 3, an area between portions of adjacent antenna coils 21' extending in a row direction L is provided with only some of the sub-pixels P located in a same row, an area between portions of adjacent antenna coils 21' extending in a column direction V is provided with only some of the sub-pixels P located in a same column. However, the area between portions of the adjacent antenna coils 21' extending in the row direction L can also be provided with some of the sub-pixels P located in multiple rows; and the area between portions of the adjacent antenna coils 21' extending in the column direction V can also be provided with some of sub-pixels P located in multiple columns. As shown in FIG. 1 and FIG. 3, the sub-pixels P are arranged in an array along the row direction L and the column direction V, the row direction L can be parallel to a direction in which the gate line 16 extends and perpendicular to a direction in which the gate lines 16 are arranged, and the column direction V can be parallel to a direction in which the data line 15 extends and perpendicular to a direction in which the data lines 15 arranged.

However, no matter which of the above conditions the width of the gap between adjacent antenna coils 21' is, referring to FIG. 1 to FIG. 6, the magnet isolator 12 can be arranged in an area in which an area between any adjacent sub-pixels P is provided with a partial of the magnet isolator 12. In other words, in the area corresponding to the magnet isolator 12, the projection of the connecting portion 12*a* along the first direction X is substantially evenly distributed between the adjacent sub-pixels P.

With continued reference to FIG. 4, in an embodiment where the display panel further includes the data line 15, the projection of the connecting portion 12*a* of the magnet isolator 12 on the first substrate 10 covers the projection of the data line 15 on the first substrate 10. With continued reference to FIG. 5, in an embodiment where the display panel further includes the gate line 16, the projection of the connecting portion 12*a* of the magnet isolator 12 on the first substrate 10 covers the projection of the gate line 16 on the first substrate 10. With continued reference to FIG. 6, in an embodiment where the display panel further includes the touch line 17, the projection of the connecting portion 12*a* of the magnet isolator 12 on the first substrate 10 covers the projection of the touch line 17 on the first substrate 10. With such design, the magnetic field can be more effectively blocked from reaching the data line 15, the gate line 16 and the touch line 17, and the loss of the magnetic field can be reduced.

The antenna layer 210 can be located on a side of the first electrode layer 110 close to a light-exiting surface of the display panel. In an embodiment, as shown in FIG. 2, FIG. 4, FIG. 5 and FIG. 6, the antenna coil 21' is located at the side of the first electrode 11 facing towards the light-exiting surface of the display panel. Generally, in the display panel, the side where the first substrate 10 provided with the transistor T, and where the data line 15 and the gate line 16 are also provided, is located on a side of a backlight surface of the display panel, and the side where the second substrate 20 opposite to the first substrate 10 is located is usually the side of the light-exiting surface of the display panel. In addition, when the first electrode 11 covers multiple sub-pixels P, then the first electrode 11 is usually used as a common electrode, so the first electrode 11 is usually provided at a position relatively close to the light-exiting surface in the conductive layer located on the first substrate 10 or provided on the second substrate 10. In an embodiment, the first electrode 11 is located at a position closer to the light-exiting surface than the data line 15, the gate line 16 and the transistor T, that is, a battery, a package casing, or a middle frame of a backlight plate are provided on the side facing away from the backlight surface of the display panel. Furthermore, since the side of the first electrode 11 in the display panel close to the light-exiting surface basically has no large-area conductive structure, the antenna coil 21' receives the magnetic field or transmits the magnetic field more smoothly, and signal integrity is better.

In an embodiment of the present disclosure, the antenna layer 210 can be located at a side of the second substrate 20 facing away from the first substrate 10. With continued reference to FIG. 2, FIG. 4, FIG. 5 and FIG. 6, the antenna coil 21' is disposed on the side of the second substrate 20 facing away from the first substrate 10, then the antenna coil 21' is a conductive structure in the display panel closest to the light-exiting surface of the display panel. In this embodiment of the present disclosure, since the antenna coil 21' is a conductive structure at the uppermost layer in the display panel, in order to ensure the integrity of the antenna coil 21' and prevent the antenna coil 21' from being corroded by water, oxygen, etc., a cover 40 can be provided on an upper side of the antenna coil 21', that is, the antenna coil 21' can be provided between the cover plate 40 and the second substrate 20.

In an embodiment of the present disclosure, the magnet isolating layer 120 is located between the first substrate 10 and the second substrate 20. With continued reference to FIG. 2, FIG. 4, FIG. 5 and FIG. 6, when the magnet isolator 12 is located between the first substrate 10 and the second substrate 20, then the distance between the magnet isolator 12 and the antenna coil 21' is relatively far. Since a density of the magnetic field lines of the magnetic field generated by the antenna coil 21' is closely related to the distance between the antenna coil 21' and the magnet isolator 12, when the magnet isolator 12 is relatively far away from the antenna coil 21', the density of the magnetic field lines at the position where the magnet isolator 12 is located will be relatively large, that is, a magnetic flux density is relatively large. When magnetic field strength of the magnetic field generated at the antenna coil 21' is constant, the larger the density of the magnetic field lines at the magnet isolator 12, that is, the more concentrated the magnetic field, then an ability of the magnet isolator 12 to shield the magnetic field generated by the antenna coil 21' will be improved.

In an embodiment of the present disclosure, referring to FIG. 2, FIG. 4, FIG. 5 and FIG. 6, the magnet isolator 12 is provided on the first substrate 10, that is, the magnet isolator 10 can be provided on one layer of the first substrate 10.

As shown in FIG. 2, the magnet isolator 12 can be in direct contact with the first electrode 11, so that the thickness of the display panel can be reduced. In order to avoid the eddy current loss of the magnetic field in the magnet isolator 12, the magnet isolator 12 is made of materials having excellent electrical insulation, and all voltages transmitted in respective signal lines of the display panel are not capable of causing a current to be generated between the magnet isolator 12 and the first electrode 11, so even if the magnet isolator 12 directly contacts the first electrode 11, there is no risk of short circuit between the first electrodes 11, and the signal in the first electrodes 11 will not be affected by the magnet isolator 12.

As shown in FIG. 4, FIG. 5 and FIG. 6, a first insulating layer 14 can also be provided between the magnet isolator 12 and the first electrode 11, and the magnet isolator 12 can be directly provided on the first insulating layer 14. The first insulating layer 14 can provide a flat surface for the magnet isolator 12, to avoid a risk of breakage of the magnet isolator 12 at a position between adjacent first electrodes 11.

Figure 8:
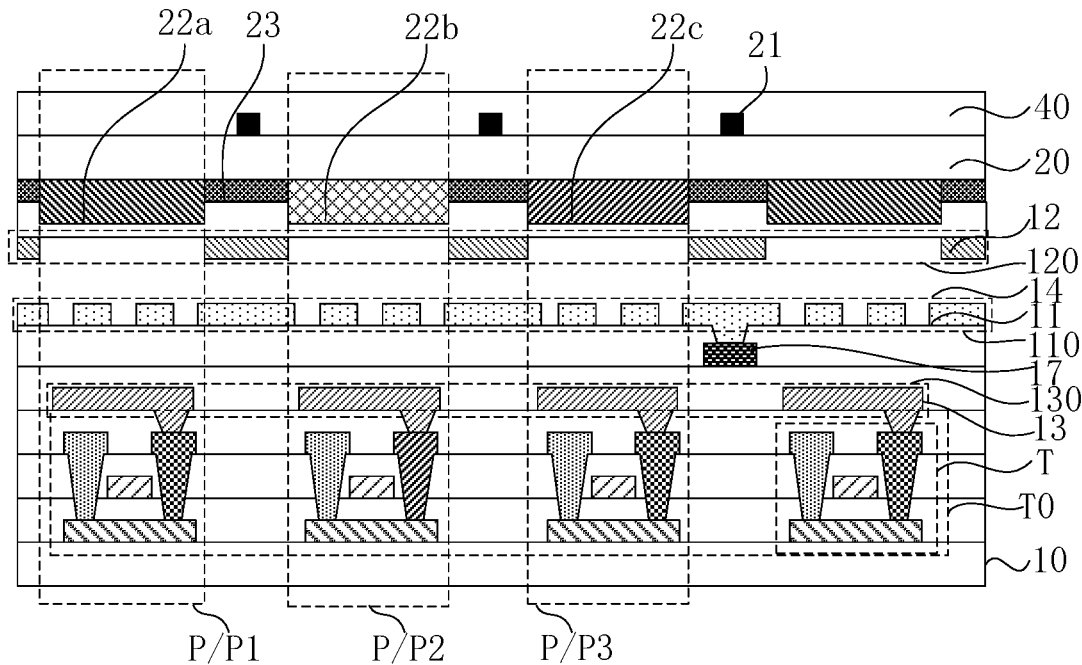
FIG. 8 illustrates another cross-sectional diagram taken along a direction MN shown in FIG. 1.

FIG. 8 illustrates another cross-sectional diagram taken along the direction MN shown in FIG. 1. In an embodiment of the present disclosure, the magnet isolating layer 120 is disposed on the second substrate 20. As shown in FIG. 8, the magnet isolator 12 is provided on the second substrate 20, that is, the magnet blocking layer 120 serves as a layer provided on the second substrate 20. In an embodiment, the magnet isolator 12 can be disposed at the side of the second substrate 20 facing towards the first substrate 10. Since there are relatively few layers on the second substrate 20, it is easier to add a new layer on the second substrate 20.

Figure 9:
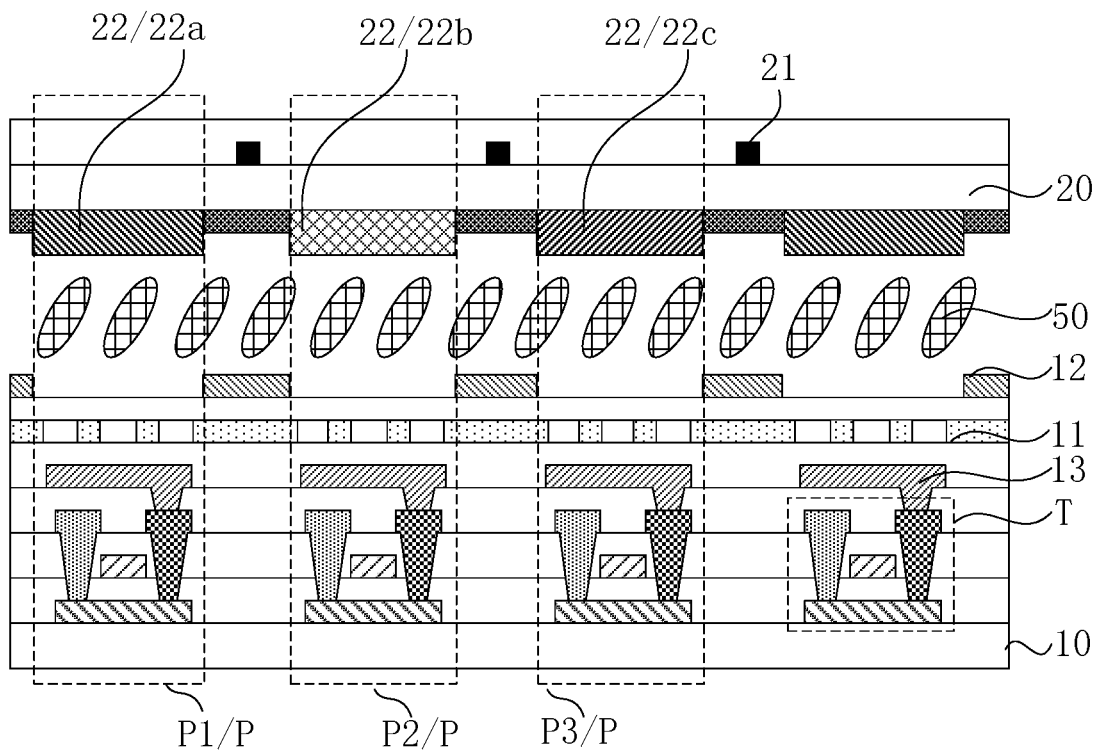
FIG. 9 illustrates a schematic diagram of a display panel provided by an embodiment of the present disclosure.
Figure 10:
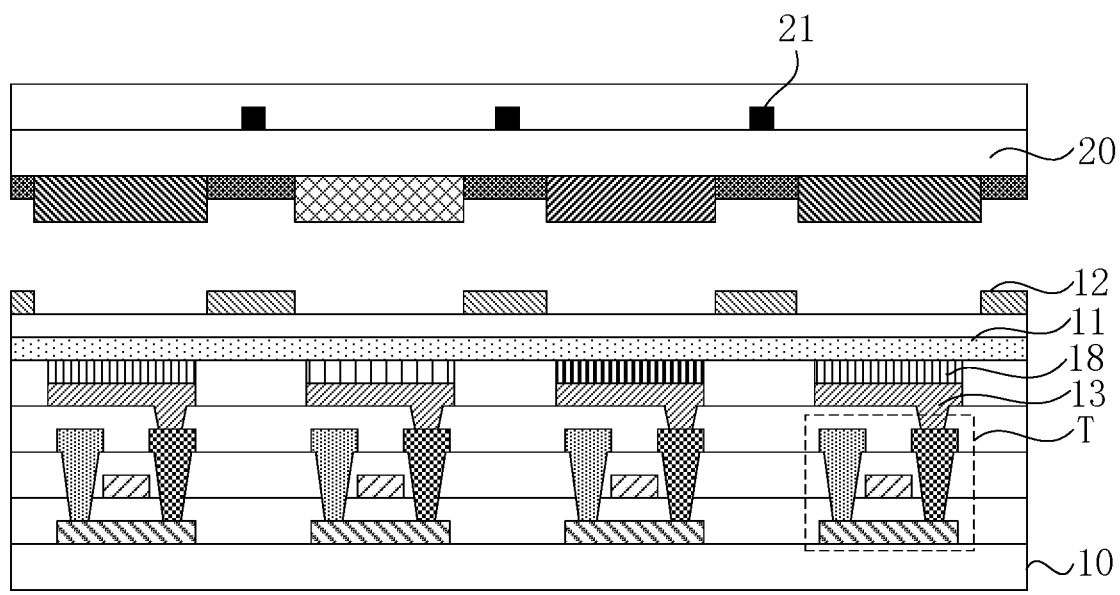
FIG. 10 illustrates a schematic diagram of a display panel provided by another embodiment of the present disclosure.

FIG. 9 illustrates a schematic diagram of a display panel provided by an embodiment of the present disclosure, and FIG. 10 is a schematic diagram of another display panel provided by an embodiment of the present disclosure.

In an embodiment of the present disclosure, as shown in FIG. 9, the display panel further includes a liquid crystal layer 50, and the liquid crystal layer 50 is disposed in a gap formed between the first substrate 10 and the second substrate 20. In this case, the first electrode 11 of the first substrate 10 can be a common electrode, and the second electrode 13 can be a pixel electrode. During a displaying process, an electric field is formed between the first electrode 11 and the second electrode 13, and an electric field also is formed at a position where the liquid crystal layer 50 is located. Liquid crystal molecules in the liquid crystal layer 50 rotate a certain angle under by the electric field, and if a rotation angle of the liquid crystal molecules is different, an amount of light allowed to pass is different, so that different gray scales can be displayed. In order to realize a color display, it is necessary to provide color resists 22 of different colors at positions where sub-pixels P of the display panel is located.

In an embodiment of the present disclosure, as shown in FIG. 10, an organic light-emitting layer can also be provided on the first substrate 10 of the display panel, and the organic light-emitting layer includes organic light-emitting materials 18 of different colors provided corresponding to the sub-pixels P of different colors. In this case, the first electrode 11 can be a cathode electrode, and the second electrode 13 can be an anode electrode. Electrons in the first electrode 11 and holes in the second electrode 13 combine in the organic light-emitting material 18 and release energy, so that electrons of light-emitting molecules in the organic light-emitting material 18 are excited to an excited state, and visible light is generated during a de-excitation process. In addition, different organic light-emitting materials 18 can be used to achieve light emission of different colors. In order to enhance injection and transport capabilities of the electrons and the holes, an electron injection layer can also be provided between the first electrode 11 and the organic light-emitting material 18, and a hole transport layer is provided between the second electrode 13 and the organic light-emitting material layer 18.

Figure 11:
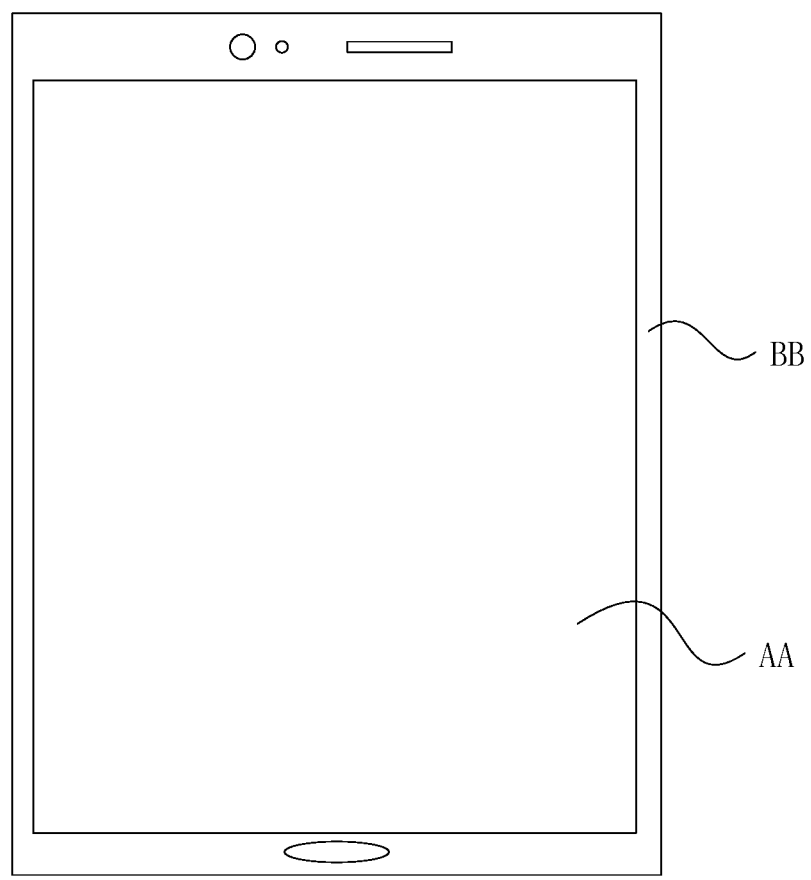
FIG. 11 illustrates a schematic diagram of a display device provided by an embodiment of the present disclosure.

FIG. 11 illustrates a schematic diagram of a display device provided by an embodiment of the present disclosure. The display device provided by the embodiment of the present disclosure includes the display panel provided by any one of the above embodiments. The display device provided by the embodiment of the present disclosure can be a mobile phone. In addition, the display device provided by the embodiment of the present disclosure can also be a display device such as a computer or a TV, and the display device has an NFC function.

The antenna coil of the display device provided by the embodiment of the present disclosure is provided at the light-exiting surface side of the display device, and the magnet isolator is provided between the antenna coil and the first electrode, so the display device provided by the embodiment of the present disclosure provides an excellent and stable near field communication.

The above are only the exemplary embodiments of the present disclosure and are not intended to limit the present disclosure. Any modifications, equivalents, improvements, etc., which are made within the spirit and principles of the present disclosure, should be included in the scope of the present disclosure.

What is claimed is:

1. A display panel having a display area and a non-display area surrounding the display area, the display panel comprising:
   a plurality of sub-pixels located in the display area;
   a first substrate;
   a second substrate located opposite to the first substrate;
   a first electrode layer located at a side of the first substrate facing towards the second substrate, wherein the first electrode layer comprises at least one first electrode covering at least two of the plurality of sub-pixels in a first direction;
   an antenna layer comprising at least one antenna, wherein one of the at least one antenna comprises a multi-turn antenna coil; and
   a magnet isolating layer comprising at least one magnet isolator, wherein one of the at least one magnet isolator corresponds to at least one of the at least one antenna;
   a switch array layer located at a side of the first electrode layer facing away from the magnet isolating layer, the switch array layer comprising a plurality of transistors; and
   a second electrode layer disposed at a side of the first electrode layer close to the magnet isolating layer and comprising a plurality of second electrodes, the plurality of second electrodes being arranged in a one-to-one correspondence with the plurality of sub-pixels and electrically connected to the plurality of transistors,
   wherein the switch array layer, the first electrode layer, the magnet isolating layer, the second electrode layer, and the antenna layer are vertically stacked such that the magnet isolating layer is between the switch array layer and the antenna layer; and
   wherein the magnet isolating layer is disposed between the first electrode layer and the antenna layer along the first direction, and wherein the first direction is a thickness direction of the display panel.

2. The display panel according to claim 1, wherein the antenna layer is located at a side of the first electrode layer close to a light-exiting surface of the display panel.

3. The display panel according to claim 2, wherein the antenna layer is located at a side of the second substrate facing away from the first substrate.

4. The display panel according to claim 1, wherein the magnet isolating layer is located between the first substrate and the second substrate.

5. The display panel according to claim 4, wherein one of the at least one magnet isolator is in contact with one of the at least one first electrode.

6. The display panel according to claim 4, wherein a first insulating layer is provided between one of the at least one magnet isolator and one of the at least one first electrode.

7. The display panel according to claim 4, wherein the magnet isolating layer is provided on the second substrate.

8. The display panel according to claim 1, further comprising:
a touch line layer located at a side of the magnet isolating layer facing away from the antenna layer and comprising a plurality of touch lines, wherein the at least one first electrode comprises a plurality of first electrodes, and each of the plurality of first electrodes is electrically connected to at least one of the plurality of touch lines.

9. The display panel according to claim 1, wherein a projection of the at least one magnet isolator on the first substrate covers a projection of at least one corresponding antenna of the at least one antenna on the first substrate.

10. The display panel according to claim 1, wherein each of the at least one magnet isolator comprises a plurality of hollow portions and a plurality of connecting portions, wherein one of the plurality of connecting portions is located between adjacent ones of the plurality of hollow portions and between adjacent ones of the plurality of sub-pixels in a direction perpendicular to the first direction.

11. The display panel according to claim 10, wherein projections of the plurality of connecting portions on the first substrate cover a projection of the multi-turn antenna coil on the first substrate.

12. The display panel according to claim 10, wherein each of the plurality of connecting portions is made of a material comprising ferrite.

13. A display device, comprising:
a display panel having a display area and a non-display area surrounding the display area, wherein the display panel comprises:
a plurality of sub-pixels located in the display area;
a first substrate;
a second substrate located opposite to the first substrate;
a first electrode layer located at a side of the first substrate facing towards the second substrate, wherein the first electrode layer comprises at least one first electrode covering at least two of the plurality of sub-pixels in a first direction;
an antenna layer comprising at least one antenna, one of the at least one antenna comprising a multi-turn antenna coil;
a magnet isolating layer comprising at least one magnet isolator, one of the at least one magnet isolator corresponding to at least one of the at least one antenna;
a switch array layer located at a side of the first electrode layer facing away from the magnet isolating layer, the switch array layer comprising a plurality of transistors; and
a second electrode layer disposed at a side of the first electrode layer close to the magnet isolating layer or a side of the first substrate facing towards the second substrate and comprising a plurality of second electrodes, the plurality of second electrodes being arranged in a one-to-one correspondence with the plurality of sub-pixels and electrically connected to the plurality of transistors,
wherein the switch array layer, the first electrode layer, the magnet isolating layer, the second electrode layer, and the antenna layer are vertically stacked such that the magnet isolating layer is between the switch array layer and the antenna layer; and
wherein the magnet isolating layer is disposed between the first electrode layer and the antenna layer along the first direction, and wherein the first direction is a thickness direction of the display panel.

14. A display panel having a display area and a non-display area surrounding the display area, the display panel comprising:
a plurality of sub-pixels located in the display area;
a first substrate;
a second substrate located opposite to the first substrate;
a first electrode layer located at a side of the first substrate facing towards the second substrate, wherein the first electrode layer comprises at least one first electrode covering at least two of the plurality of sub-pixels in a first direction;
an antenna layer comprising at least one antenna, wherein one of the at least one antenna comprises a multi-turn antenna coil;
a magnet isolating layer comprising at least one magnet isolator, wherein one of the at least one magnet isolator corresponds to at least one of the at least one antenna;
a switch array layer located at a side of the first electrode layer facing away from the magnet isolating layer, the switch array layer comprising a plurality of transistors; and
a second electrode layer disposed at the side of the first electrode layer facing away from the magnet isolating layer and comprising a plurality of second electrodes, the plurality of second electrodes being arranged in a one-to-one correspondence with the plurality of sub-pixels and electrically connected to the plurality of transistors,
wherein the switch array layer, the first electrode layer, the magnet isolating layer, the second electrode layer, and the antenna layer are vertically stacked such that the magnet isolating layer is between the switch array layer and the antenna layer; and
wherein the magnet isolating layer is disposed between the first electrode layer and the antenna layer along the first direction, and wherein the first direction is a thickness direction of the display panel.

* * * * *